(12) United States Patent
Chang

(10) Patent No.: US 8,295,791 B2
(45) Date of Patent: Oct. 23, 2012

(54) RF FRONT-END CIRCUIT

(75) Inventor: Ping-Chun Chang, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 526 days.

(21) Appl. No.: 12/686,585

(22) Filed: Jan. 13, 2010

(65) Prior Publication Data

US 2010/0285833 A1  Nov. 11, 2010

(30) Foreign Application Priority Data

May 11, 2009 (CN) .......................... 2009 1 0302214

(51) Int. Cl.
*H04B 1/04* (2006.01)

(52) U.S. Cl. ................... 455/114.3; 455/115.1; 375/296

(58) Field of Classification Search ............... 455/73, 455/91, 95, 102, 103, 114.1, 114.2, 114.3, 455/115.1, 127.1; 375/295, 296; 330/49, 330/51, 129, 149
See application file for complete search history.

(56) References Cited

U.S. PATENT DOCUMENTS

| 7,545,859 | B2 | 6/2009 | Reichard | |
|---|---|---|---|---|
| 2009/0221245 | A1* | 9/2009 | Gonikberg et al. | ......... 455/114.3 |
| 2009/0289707 | A1* | 11/2009 | Watanabe | ..................... 330/149 |
| 2010/0111221 | A1* | 5/2010 | Nash et al. | ..................... 375/296 |

* cited by examiner

*Primary Examiner* — Thanh Le
(74) *Attorney, Agent, or Firm* — Altis Law Group, Inc.

(57) ABSTRACT

A RF front-end circuit connected to an antenna module includes a plurality of main transmission circuits, an assistant transmission circuit, a signal coupling circuit, and a switching module. Each of the main transmission circuits amplifies original signals as first amplified signals which include non-linear distortion. The assistant transmission circuit assists at least one of the main transmission circuits to reduce non-linear distortion. The signal coupling circuit coupled to the at least one main transmission circuit samples the first amplified signals from the main transmission circuit to obtain sampling signals. The assistant transmission circuit calculates the non-linear distortion of the main transmission circuit according to the sampling signals and the original signals, and generates compensation signals accordingly. The signal coupling circuit feeds back the compensation signals to the main transmission circuit to decrease non-linear distortion in the first amplified signals.

13 Claims, 3 Drawing Sheets

RF FRONT-END CIRCUIT

BACKGROUND

1. Technical Field

Embodiments of the present disclosure relate to multi-input and multi-output transceivers, and more particularly to a radio frequency (RF) front-end circuit.

2. Description of Related Art

Presently, electromagnetic signals must be amplified by RF transmission circuit before being transmitted via radio frequency (RF) communication to maintain a certain power level. In general, the RF transmission circuit is configured with one or more non-linear components that are prone to generating non-linear distortion when the RF transmission circuit amplifies the electromagnetic signals.

Often, in order to achieve the power required for transmission and assure the quality of the transmitted electromagnetic signals, a distortion detection circuit and a distortion reduction circuit comprising various components, such as a plurality of delay loops, attenuators, phase shifters, and amplifiers, are added to each RF transmission circuit. Due to the number of components, cost and size of the front-end RF transmission circuit are consequentially increased.

BRIEF DESCRIPTION OF THE DRAWINGS

The details of the disclosure, both as to its structure and operation, can best be understood by referring to the accompanying drawings, in which like reference numbers and designations refer to like elements.

DETAILED DESCRIPTION

Figure 1:
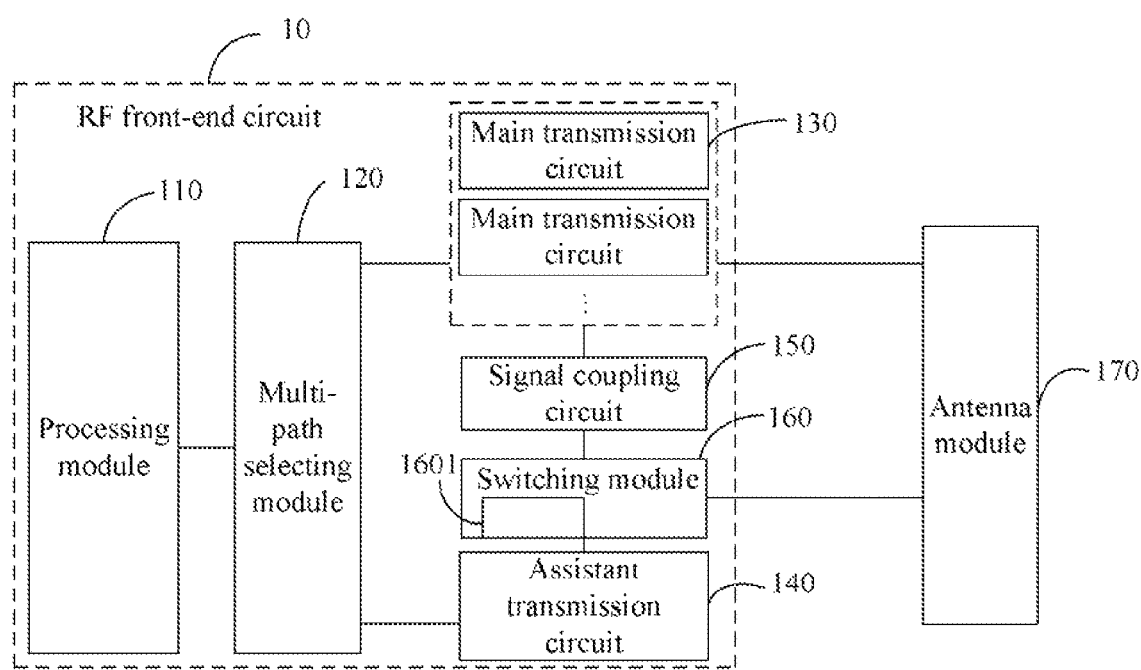
FIG. 1 is a schematic diagram of one embodiment of functional modules of a radio frequency (RF) front-end circuit of the present disclosure.

FIG. 1 is a schematic diagram of functional modules of one embodiment of a radio frequency (RF) front-end circuit 10 of the present disclosure. In one embodiment, the RF front-end circuit 10 may be applied in a transceiver, and cooperates with an antenna module 170. The RF front-end circuit 10 is operable to amplify original signals and output first amplified signals, and radiate the first amplified signals via the antenna module 170. In one example, the original signals may be electromagnetic signals, such as low frequency signals, and the first amplified signals may be high frequency signals, such as RF signals. In one embodiment, the first amplified signals include non-linear distortion generated during the amplification. That is, the first amplified signals may be distorted by the RF-front end circuit 10, where the distortion may be non-linear. In one embodiment, the first amplified signals include non-linear distortion generated during the amplification. The antenna module 170 may be an antenna array, an antenna assembly, or a single antenna.

In one embodiment, the RF front-end circuit 10 includes a processing module 110, a multi-path selecting module 120, a plurality of main transmission circuits 130, an assistant transmission circuit 140, a signal coupling circuit 150, and a switching module 160. In one embodiment, the RF front-end circuit 10 not only amplifies the original signals and outputs the first amplified signals via the main transmission circuit 130, but also reduces the non-linear distortion of the first amplified signals via the assistant transmission circuit 140 to maintain the power of the first amplified signals at a suitable level for transmission.

In one embodiment, the multi-path selecting module 120 is operable to select one main transmission circuit 130 to amplify the original signals, and select the assistant transmission circuit 140 to assist the main transmission circuit 130 in reducing the non-linear distortion in the first amplified signals.

It should be noted that the present disclosure is not limited to only one assistant transmission circuit 140. More than one assistant transmission circuit 140 may be included in the RF front-end circuit 10 according to different designs. In such case, the multi-path selecting module 120 is further operable to select one assistant transmission circuit 140 to reduce the non-linear distortion in the first amplified signals for one of the main transmission circuits 130. In one embodiment, the multi-path selecting module 120 selects only one main transmission circuit 130 or one assistant transmission circuit 140 to transmit the first amplified signals if precision of the signals is low. The precision of the signals is defined according to different communication rules (such as FCC) and protocols (such as 802.16) of different areas. In one embodiment, the multi-path selecting module 120 is controlled by the processing module 110.

Each of the main transmission circuits 130 is operable to amplify the original signals to create amplified original signals, known as first amplified signals. The first amplified signals include non-linear distortion.

The assistant transmission circuit 140 is operable to reduce the non-linear distortion in the first amplified signals. In one embodiment, the assistant transmission circuit 140 is also operable to amplify the original signals as the first amplified signals.

The signal coupling circuit 150 is coupled to the plurality of main transmission circuits 130 and operable to sample the first amplified signals from the main transmission circuits 130 to obtain sampling signals. In one embodiment, the assistant transmission circuit 140 calculates the non-linear distortion in the first amplified signals according to the sampling signals and the original signals, and generates compensation signals according to the non-linear distortion. In one embodiment, the signal coupling circuit 150 feeds the compensation signals back to the main transmission circuit 130 to reduce the non-linear distortion of the first amplified signals. Thus, the quality and the power of the first amplified signals are maintained.

The switching module 160 comprises a first switch 1601 operable to selectively connect the assistant transmission circuit 140 to either the signal coupling circuit 150 or the antenna module 170. In one embodiment, the assistant transmission circuit 140 assists the plurality of main transmission circuits 130 in reducing the non-linear distortion in the first amplified signals when the switching module 160 connects the assistant transmission circuit 140 to the signal coupling circuit 150. At the same time, the processing module 110 inputs the same original signals to the assistant transmission circuit 140 as those input to the main transmission circuit 130. In one embodiment, the processing module 110 is further operable to turn the switching module 160 on and off. The processing module 110 may be a media access controller, a base band processor, a radio frequency converter, or a logic controller, for example.

Figure 2:
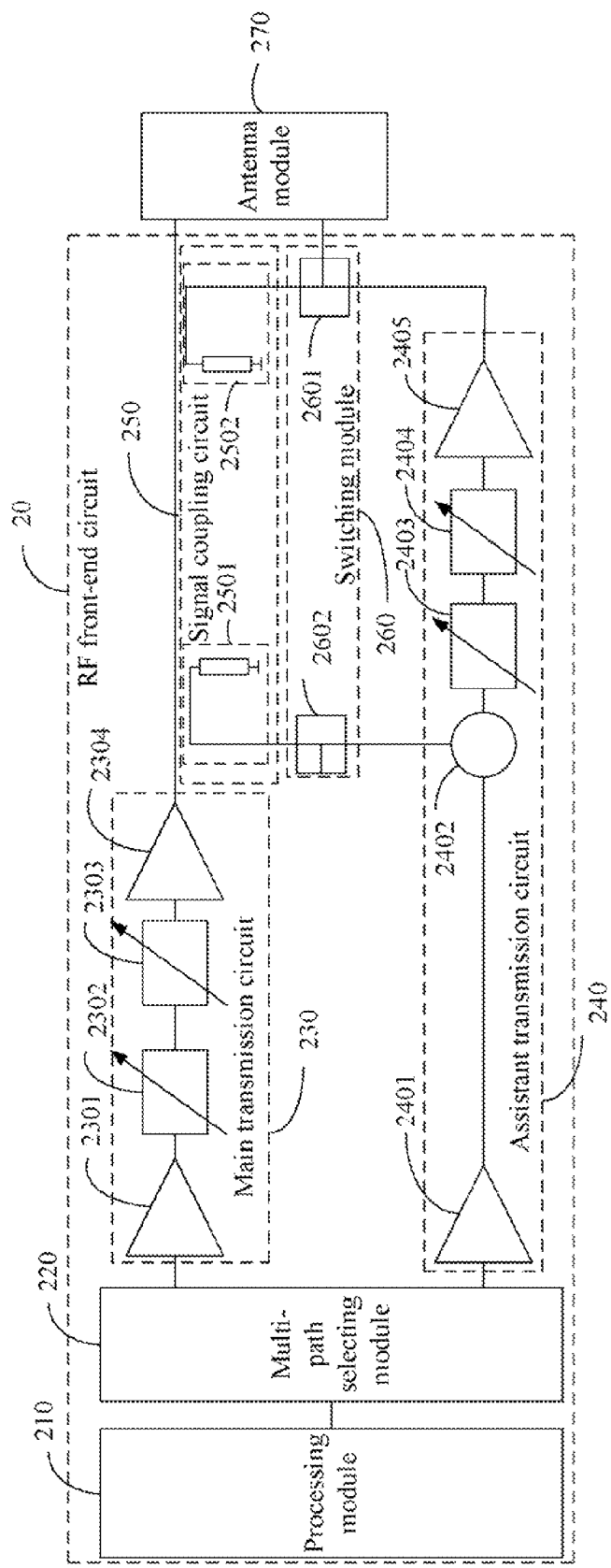
FIG. 2 is a detailed circuit diagram of one embodiment of the RF front-end circuit of FIG. 1.

FIG. 2 is a detailed circuit diagram of one embodiment of the RF front-end circuit 20 of FIG. 1, in which a processing module 210, a multi-path selecting module 220, a main transmission circuit 230, an assistant transmission circuit 240, a signal coupling circuit 250, a switching module 260, and an antenna module 270 have the same function as these corresponding modules of FIG. 1.

In one embodiment, the main transmission circuit 230 includes a first linear preamplifier 2301, a first adjustable attenuator 2302, a first adjustable phase shifter 2303, and a main RF power amplifier 2304. The first linear preamplifier 2301, the first adjustable attenuator 2302, the first adjustable phase shifter 2303, and the main RF power amplifier 2304 are connected in series.

In one embodiment, the first adjustable attenuator 2302 and the first adjustable phase shifter 2303 are respectively operable to adjust amplitude and phase of original signals. In other embodiments, the processing module 210 can adjust the amplitude and the phase of original signals, so the main transmission circuit 230 excludes the first adjustable attenuator 2302 and the first adjustable phase shifter 2303.

The assistant transmission circuit 240 includes a second linear preamplifier 2401, a combiner 2402, a second adjustable attenuator 2403, a second adjustable phase shifter 2404, and a second main RF power amplifier 2405, which are connected in series. In one embodiment, the functions of the second linear preamplifier 2401, the second adjustable attenuator 2403, the second adjustable phase shifter 2404, and the second main RF power amplifier 2405 are the same as those of the first linear preamplifier 2301, the first adjustable attenuator 2302, the first adjustable phase shifter 2303, and the main RF power amplifier 2304, respectively.

In one embodiment, a first terminal of the combiner 2402 is connected to an output of the second linear preamplifier 2401, a second terminal of the combiner 2402 is connected to the switching module 260, and a third terminal of the combiner 2402 is connected to the second adjustable attenuator 2403. The combiner 2402 is operable to calculate the non-linear distortion according to the original signals from the second linear preamplifier 2401 and the sampling signals from the switching module 260.

The signal coupling circuit 250 includes a plurality of first coupling circuits 2501 and a plurality of second coupling circuits 2502 corresponding to the plurality of main transmission circuits 230. Each first coupling circuit 2501 is operable to sample the first amplified signals from the corresponding main transmission circuit 230 to output the sampling signals. Each second coupling circuit 2502 is operable to feed the compensation signals back to the corresponding main transmission circuit 230. In one embodiment, the first coupling circuit 2501 and the second coupling circuit 2502 each include a coupler and a resistor. The coupler and the resistor are connected in series, and the coupler is a transmission line coupler. In one embodiment, the number of first coupling circuits 2501 is the same as that of the second coupling circuits 2502 and the number of main transmission circuits 230.

In one embodiment, the switching module 260 includes a first switch 2601 and a second switch 2602. In one embodiment, the first switch 2601 has the same function as that of the first switch 1601 of FIG. 1, the second switch 2602 is connected among the plurality of first coupling circuits 2501 and the assistant transmission circuit 240, and is operable to selectively connect the plurality of first coupling circuits 2501 to the assistant transmission circuit 240.

A first terminal of the first switch 2601 connects to the second main RF power amplifier 2405, a second terminal connects to the antenna module 260, and other terminals connect to the plurality of second coupling circuits 2502. In one embodiment, the processing module 210 is operable to turn the first switch 2601 and the second switch 2602 on and off.

In one embodiment, if the multi-path selecting module 220 selects the assistant transmission circuit 240 to amplify the original signals, the first switch 2601 disconnects the combiner 2402 from the first coupling circuit 2501, and the first switch 2601 disconnects the second RF power amplifier 2405 from the second coupling circuit 2502 and connects the second RF power amplifier 2405 to the antenna module 270.

If the multi-path selecting module 220 selects the assistant transmission circuit 240 to reduce the non-linear distortion of the first amplified signals, then the second switch 2602 connects the combiner 2402 to the first coupling circuit 2501, and the first switch 2601 connects the second coupling circuit 2502 to the second main RF power amplifier 2405. In one embodiment, the second linear preamplifier 2401, the combiner 2402, the first linear preamplifier 2301, the first adjustable attenuator 2302, the first adjustable phase shifter 2303, the first main RF power amplifier 2304, and the first coupling circuit 2501 form a non-linear distortion detection loop. The second adjustable attenuator 2403, the second adjustable phase shifter 2404, the second main RF power amplifier 2405, and the second coupling circuit 2502 form a non-linear distortion reducing loop. The non-linear distortion reducing loop is operable to feed the compensation signals back to the main transmission circuit 230 according to the non-linear distortion detecting by the non-linear distortion detection loop to reduce the non-linear distortion in the first amplified signals.

In one embodiment, the first coupling circuit 2501 is coupled to the main transmission circuit 130 to sample the first amplified signals of the main transmission circuit 230 as the sampling signals, and outputs the sampling signals to the combiner 2402. The combiner 2402 subtracts the sampling signals from the original signals to obtain the non-linear distortion. The second adjustable attenuator 2403 and the second adjustable phase shifter 2404 are operable to adjust amplitude and phase of the non-linear distortion, then the second main RF power amplifier 2405 is operable to amplify the non-linear distortion to generate the compensation signals. The second coupling circuit 2502 feeds the compensation signals back to the main transmission circuit 230 to reduce the non-linear distortion of the first amplified signals.

In one embodiment, the time for the main transmission circuit 230 to process the original signals is almost the same as that for the assistant transmission circuit 240 to generate compensation signals, so the first amplified signals and the compensation signals can be synchronized.

In the present disclosure, the assistant transmission circuit 240 can either transmit the signal or reduce the non-linear distortion of the main transmission circuit 230. Thus, the RF front-end circuit 20 requires no additional distortion detection or reduction circuits to maintain the power of the first amplified signals and reduce the non-linear distortion of the first amplified signals. Thus, the cost and the space of the RF front-end circuit 20 are reduced.

Figure 3:
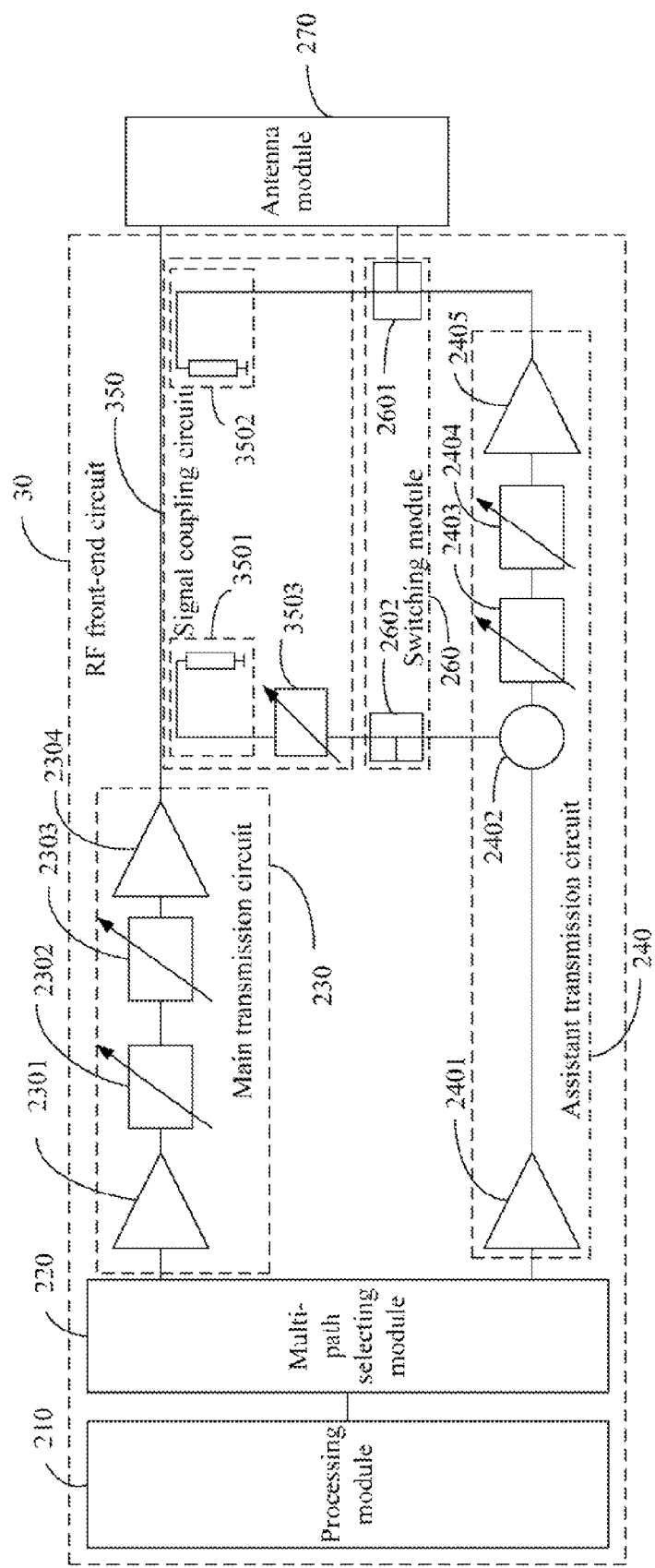
FIG. 3 is a detailed circuit diagram of another embodiment of the RF front-end circuit of FIG. 1.

FIG. 3 is a detailed circuit diagram of another embodiment of the RF front-end circuit 30 of FIG. 1, differing from RF front-end circuit 20 in FIG. 2 only in that a signal coupling circuit 350 further includes a third adjustable attenuator 3503. The third adjustable attenuator 3503 connected between a first coupling circuit 3501 and the second switch 2602, is operable to adjust amplitude of the sampling signals of the first coupling circuit 3501 to improve compensation signals and output better first amplified signals.

In one embodiment, the number of the third adjustable attenuators 3503 is the same as the number of the first coupling circuits 3501.

In the present disclosure, the RF front-end circuit 10 utilizes the processing module 110, the multi-path selecting module 120, the main transmission circuits 130, the assistant transmission circuit 140, the signal coupling circuit 150, the switching module 160, and the antenna module 170 to amplify the original signals, reduces the non-linear distortion of the first amplified signals, and transmits the first amplified signals. The RF front-end circuit 10 requires no additional distortion detection or reduction circuits to maintain the power of the first amplified signals and reduce the non-linear distortion of the first amplified signals. Thus, the cost and the size of the RF front-end circuit 20 are reduced.

Although the features and elements of the present disclosure are described in various inventive embodiments in particular combinations, each feature or element can be configured alone or in various within the principles of the present disclosure to the full extent indicated by the broad general meaning of the terms in which the appended claims are expressed.

What is claimed is:

1. A radio frequency (RF) front-end circuit connected to an antenna module, the RF front-end circuit comprising:
   a plurality of main transmission circuits, each operable to amplify original signals as first amplified signals, wherein the first amplified signals comprise non-linear distortion;
   an assistant transmission circuit operable to reduce the non-linear distortion in the first amplified signals;
   a signal coupling circuit coupled to the main transmission circuits, operable to sample the first amplified signals from the main transmission circuits to obtain sampling signals, wherein the assistant transmission circuit calculates the non-linear distortion in the first amplified signals according to the sampling signals and the original signals, and generates compensation signals according to the non-linear distortion, wherein the signal coupling circuit further feeds back the compensation signals to the main transmission circuits to reduce the non-linear distortion of the first amplified signals; and
   a switching module comprising a first switch operable to selectively connect the assistant transmission circuit to either the signal coupling circuit or the antenna module, wherein the assistant transmission circuit assists the plurality of main transmission circuits to reduce the non-linear distortion in the first amplified signals when the switching module connects the assistant transmission circuit to the coupling circuit.

2. The RF front-end circuit as claimed in claim 1, wherein the signal coupling circuit comprises a plurality of first coupling circuits corresponding to the plurality of main transmission circuits to sample the first amplified signals of the corresponding main transmission circuit and output the sampling signals.

3. The RF front-end circuit as claimed in claim 2, wherein the signal coupling circuit further comprises a plurality of second coupling circuits corresponding to the plurality of main transmission circuits, and each second coupling circuit is operable to feed back the compensation signals to the corresponding main transmission circuit.

4. The RF front-end circuit as claimed in claim 3, wherein the switching module further comprises a second switch connected to the plurality of first coupling circuits and the assistant transmission circuit, and operable to selectively connect one of the plurality of first coupling circuits to the assistant transmission circuit.

5. The RF front-end circuit as claimed in claim 4, wherein the main transmission circuit comprises a first linear preamplifier and a first main RF power amplifier, connected in series and operable to amplify the original signals.

6. The RF front-end circuit as claimed in claim 5, wherein the main transmission circuit further comprises a first adjustable attenuator and a first adjustable phase shifter, which are connected between the first linear preamplifier and the main RF power amplifier, are respectively operable to adjust amplitude and phase of the original signals.

7. The RF front-end circuit as claimed in claim 4, wherein the assistant transmission circuit further comprises a second linear preamplifier, a combiner, a second adjustable attenuator, a second adjustable phase shifter, and a second main RF power amplifier, connected in series and operable to amplify the original signals or reduce the non-linear distortion of the first amplified signals.

8. The RF front-end circuit as claimed in claim 7, wherein the second switch is connected between the combiner and the first coupling circuit.

9. The RF front-end circuit as claimed in claim 8, wherein the first switch is connected among the second main power amplifier, the second coupling circuits, and the antenna module.

10. The RF front-end circuit as claimed in claim 4, wherein the signal coupling circuit further comprises a third adjustable attenuator operable to adjust amplitude of the sampling signals.

11. The RF front-end circuit as claimed in claim 4, wherein the assistant transmission circuit is further operable to amplify the original signals when the second switch connects the assistant transmission circuit to the antenna module.

12. The RF front-end circuit as claimed in claim 4, further comprising a multi-path selecting module operable to select one main transmission circuit from the plurality of transmission circuits to amplify the original signals.

13. The RF front-end circuit as claimed in claim 12, further comprising a processing module operable to control the multi-path selecting module and the switch module.

* * * * *